US008912616B2

(12) United States Patent
Fertig et al.

(10) Patent No.: US 8,912,616 B2
(45) Date of Patent: Dec. 16, 2014

(54) DEVICE FOR DETECTING ELECTROMAGNETIC RADIATION COMPRISING A DIFFUSION JUNCTION AND A RESONANT GRATING IN A SINGLE LAYER

(75) Inventors: Matthias Fertig, Konz (DE); Thomas Morf, Gross (CH); Nkolaj Moll, Zurich (CH); Martin Kreissig, Frankfurt (DE); Karl-Heinz Brenner, Mannheim (DE); Maximilian Auer, Mannheim (DE)

(73) Assignee: International Business Machines Corporaion, Armonk, NY (US)

( * ) Notice: Subject to any disclaimer, the term of this patent is extended or adjusted under 35 U.S.C. 154(b) by 510 days.

(21) Appl. No.: 13/353,496

(22) Filed: Jan. 19, 2012

(65) Prior Publication Data

US 2012/0206723 A1  Aug. 16, 2012

(51) Int. Cl.
| | |
|---|---|
| H01L 31/103 | (2006.01) |
| H01L 31/0232 | (2014.01) |
| G01J 4/04 | (2006.01) |
| B01J 19/12 | (2006.01) |
| G01J 3/18 | (2006.01) |
| G02B 5/18 | (2006.01) |

(52) U.S. Cl.
CPC .............. *G01J 3/1804* (2013.01); *G01J 4/04* (2013.01); *G02B 5/1809* (2013.01); *H01L 31/103* (2013.01)
USPC .............. 257/436; 257/461; 438/69; 438/80; 356/364; 250/492.2

(58) Field of Classification Search
None
See application file for complete search history.

(56) References Cited

U.S. PATENT DOCUMENTS

| 4,989,972 | A | * | 2/1991 | Braun | 356/225 |
|---|---|---|---|---|---|
| 6,538,299 | B1 | * | 3/2003 | Kwark et al. | 257/458 |
| 7,821,091 | B2 | * | 10/2010 | Fertig et al. | 257/436 |
| 8,759,932 | B2 | * | 6/2014 | Gravrand et al. | 257/436 |
| 2005/0145848 | A1 | | 7/2005 | Mouli | |
| 2006/0249789 | A1 | * | 11/2006 | Deliwala | 257/347 |
| 2007/0194357 | A1 | * | 8/2007 | Oohashi et al. | 257/292 |
| 2009/0072284 | A1 | | 3/2009 | King et al. | |
| 2009/0273049 | A1 | * | 11/2009 | Fattal et al. | 257/432 |
| 2010/0038689 | A1 | | 2/2010 | Ahn et al. | |

OTHER PUBLICATIONS

N. Moll, et al., "Polarization-Independent Photo-Detectors with Enhanced Reponsivity in a Standard SOI CMOS Process," IBM Research Report, RZ 3735, #99745, Electrical Engineering, May 18, 2009.
W. Zhang, "High Gain CMOS Image Sensor Design and Fabrication on SOI and Bulk Technology," PhD. Thesis submitted to Hong Kong Univ. of Science and Technology, Dept. of Electrical Engineering, Jan. 2000.
J. Xue, "In-Situ Portable Monitoring Methods for Photolithography Characterization," Ph.D. Thesis submitted to Univ. of California, Berkeley, Graduate Division of Dept. of Electrical Engineering, Spring 2009.

* cited by examiner

*Primary Examiner* — Thomas L Dickey
*Assistant Examiner* — Joseph Schoenholtz
(74) *Attorney, Agent, or Firm* — H. Daniel Schnurmann

(57) ABSTRACT

A photodiode device including a photosensitive diffusion junction within a single layer. The photodiode device further includes a resonant grating located within the single layer. The photosensitive diffusion junction is located within the resonant grating.

15 Claims, 8 Drawing Sheets

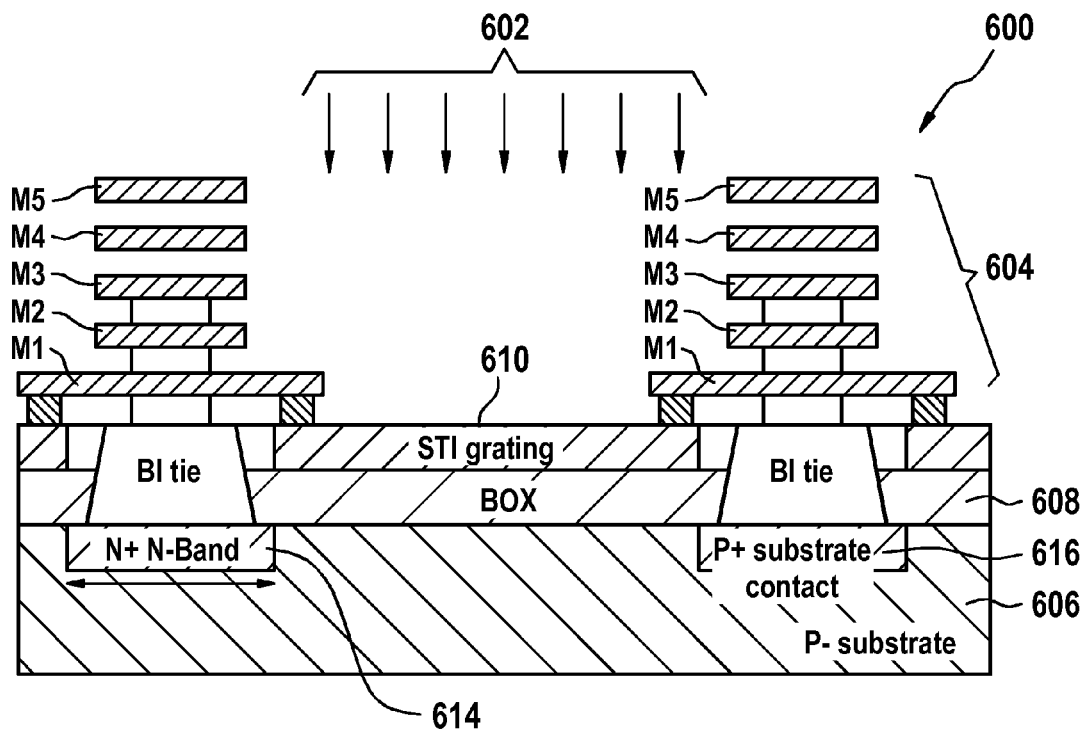
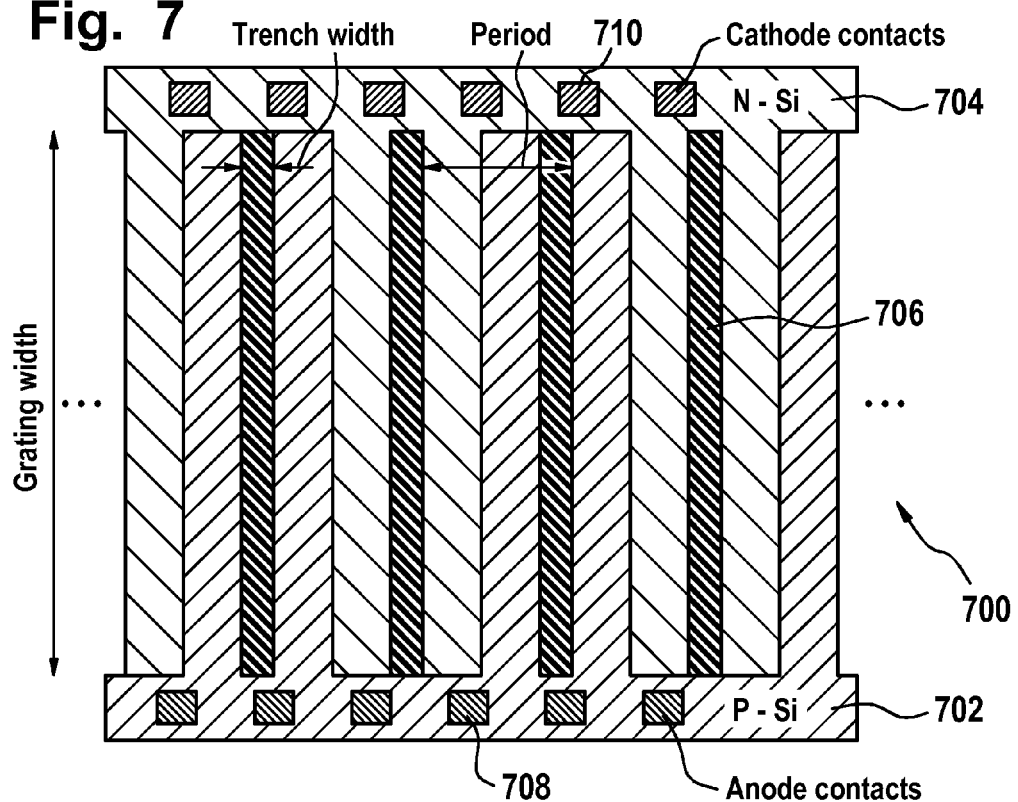

DEVICE FOR DETECTING ELECTROMAGNETIC RADIATION COMPRISING A DIFFUSION JUNCTION AND A RESONANT GRATING IN A SINGLE LAYER

CROSS REFERENCE TO RELATED APPLICATIONS

This application claims priority under 35 U.S.C. §119 from European Application No. 11154214.8 filed Feb. 11, 2011, the entire contents of which are incorporated herein by reference.

BACKGROUND OF THE INVENTION

1. Field of the Invention

The invention relates to a device which is sensitive to electromagnetic radiation, in particular to photodiodes with resonant gratings to enhance absorption of electromagnetic radiation.

2. Description of Related Art

Photo detectors can be used for the detection of light or light signals. Silicon On Insulator (SOI) technologies utilize very thin layers to form metal oxide semiconductor transistors in a complementary switching scheme to build digital CMOS circuitry. The very thin layers provide a small volume for absorbing electromagnetic radiation, compared to the absorption length.

In order to generate a voltage for switching adjacent circuitry, a sufficiently large specific charge density in the photosensitive diffusion junction or the light sensitive region is needed.

SUMMARY OF THE INVENTION

The invention provides for a photodiode device and a method in the independent claims. Aspects are given in the dependent claims.

At reduced light levels or by using thin layers for the absorption of light, the incident light cannot generate a specific charge density which is large enough to allow an adjacent circuitry to be switched. Aspects of the invention can solve this problem by using a resonant grating to concentrate electromagnetic radiation in a photosensitive diffusion junction of a photodiode device. This makes the photodiode device more sensitive to light and operable with thin layers as they appear for example in a CMOS SOI technology. Further, the resonant grating is located in the same layer of circuitry as the photodiode device. This leads to a more compact design of the photodiode device.

The design of photo detectors in a CMOS SOI technology is challenging because the layers are very thin, typically less than 100 nm. The use of a one-dimensional or two-dimensional grating provides the capability to increase the local absorption. Existing solutions utilize the polysilicon gate of a transistor to form the aforementioned one-dimensional or two-dimensional grating. With the use of metal gates (i.e. a thin metal layer underneath the polysilicon gate) the polysilicon gates can no longer be used without significant loss (i.e. >90%) of local absorption in the active region of the detector. Hence, the present invention utilizes a resonant grating which is not positioned on top/bottom of the absorbing layer. The grating is now positioned in the same layer as the absorption layer or layer of circuitry. Sometimes the Shallow Trench Isolation (STI) is used to generate a one-dimensional or two-dimensional grating. These oxide wells, which are conventionally used to isolate transistors and circuits, are now used to form a grating structure. The grating is now positioned in the same layer as the absorption layer or layer of circuitry.

A 'resonant grating' as used herein encompasses gratings are adapted for concentrating electromagnetic radiation in predetermined locations by causing peaks in the energy density of the incident electromagnetic radiation.

A 'sub-wavelength grating' as used herein is a resonant grating which has spacing between structures that is smaller than the wavelength. A characteristic spacing between structures in the sub-wavelength grating is less than the wavelength of the light being concentrated by resonances in the sub-wavelength grating. The sub-wavelength grating can cause resonances which arise in the same plane as the sub-wavelength grating.

Integrated circuits are miniaturized electronic circuits that have been manufactured in or on the surface of a thin layer or substrate. The amount of circuitry on an integrated circuit can be increased by stacking layers or levels of integrated circuits on top of each other. This is performed by manufacturing a level or layer of circuitry and then manufacturing another level of circuitry on top of the first level. As a way to more effectively use space, a layer of devices can be built on a substrate and then further layers of integrated circuits can be built upon those. A 'layer' as used herein encompasses a layer of circuitry as described above.

In one aspect the invention provides for a photodiode device including a photosensitive diffusion junction within a single layer. A photosensitive diffusion junction as used herein can also refer to a plurality of photosensitive diffusion junctions.

The photodiode device further includes a resonant grating located within the single layer. The photosensitive diffusion junction is located within the resonant grating. In other words the resonant grating is located on the same level of the integrated circuit as the diffusion junction. A resonant grating as used herein encompasses a grating which concentrates electromagnetic radiation through a resonant process. Additionally, high order modes are generated from diffraction, if the grating is not a sub-wavelength grating. This aspect is particularly advantageous because the photodiode, which is contained in a single layer, is able to more efficiently utilize incident electromagnetic radiation than a photodiode device without a resonant grating.

In another aspect the resonant grating is adapted for concentrating electromagnetic radiation incident on the photodiode device within the diffusion junction. The resonant grating is designed such that the diffusion junctions are located at points where the electromagnetic radiation is concentrated.

In another aspect, the resonant grating includes an assembly photosensitive diffusion junction.

In another aspect, the resonant grating is adapted for causing resonances in incident electromagnetic radiation.

In another aspect, the resonant grating is adapted for causing peaks in the energy density of electromagnetic radiation.

In another aspect the resonant grating is formed from patterned dielectric material and the diffusion junction. "The diffusion junction" or "a diffusion junction" can refer to multiple diffusion junctions or a plurality of diffusion junctions. This aspect is advantageous because the patterned dielectric material is compatible with known semiconductor technologies and is well developed for the use of manufacturing integrated circuits. In some cases more than one type of dielectric material is used. In this case the two types of dielectric material have indexes of refraction that are different.

In another aspect the dielectric material is shallow trench isolation. This aspect is particularly advantageous because shallow trench isolation is compatible with typical CMOS technology.

In another aspect the patterned dielectric material is formed by the repetition of a two-dimensional pattern. This can be used to form either one or two-dimensional gratings. For instance a series of lines in one direction can be a one-dimensional grating. However, this pattern is formed in two dimensions.

In another aspect the two-dimensional pattern is formed by the repetition of cross-like structures. There can for instance be bands of semiconductor material which form one or more photosensitive diffusion junctions. Cross-like structures made of dielectric embedded within the semiconductor can be used to concentrate light at the photosensitive diffusion junctions.

In another aspect the two-dimensional pattern is formed by the repetition of stair-like structures.

In another aspect the two-dimensional pattern is formed by the repetition of comb-like structures. This can be formed for instance by connecting the cross-like structures of the dielectric material. This can lead to a resonant grating which selectively concentrates polarized light.

In another aspect the two-dimensional pattern is formed by a repetition of sinusoidal like structures. The resonant grating can be defined by sinusoidal functions or functions which approximate a sinusoidal function. In some cases the shape can be defined by two shifted sinusoidal shapes.

In some aspects a two dimensional grating can be constructed with sinusoidal shaped structures. In this aspect a second grating defined by sinusoidal like structures rotated 90 degrees from a first structure is possible. This aspect can have the advantage that the photodiode device with a second trigonometric function is more robust against rotations which might arise from positioning errors of the device with respect to the incident electromagnetic wave.

In another aspect the two-dimensional pattern is formed by combining different regions of the aforementioned two-dimensional patterns.

In another aspect the photodiode device is formed on a buried oxide layer. The buried oxide layer is formed on bulk silicon.

In another aspect there is at least one bulk silicon photodiode in the bulk silicon. The at least one photodiode is under the diffusion junction. This aspect is particularly advantageous because some of the light incident on the photodiode device can go through the layer in which the diffusion junction is located. The light can then be absorbed by the silicon photodiode under the diffusion junction. This can increase the efficiency of the device.

In another aspect the at least one bulk silicon photodiode is a plurality of deep-trench PN junctions. The deep-trench PN junctions are PN junctions which are formed using the so-called embedded DRAM technology. In a deep-trench technology plasmas are typically used to cut extremely high aspect ratio or very deep trenches. This is a very advantageous aspect because this can create another set of very large PN junctions underneath the diffusion junction. This can be used to increase the efficiency of the photodiode device.

In another aspect the bulk silicon photodiode is connected in parallel or series with the diffusion junction. This is advantageous because if conducted in parallel it can be used to increase the current generated by the photodiode device. If connected in series it can be used to increase the voltage generated by the photodiode device.

In another aspect at least one resonant absorption layer is formed in the bulk silicon. This is advantageous because if the absorption layer is resonant to a particular wavelength of light it can make the photodiode device very sensitive to a particular wavelength of light.

In another aspect the photosensitive diffusion junction is a plurality of photosensitive diffusion junctions.

In another aspect the photosensitive diffusion junction is a PN junction.

In another aspect the photosensitive diffusion junction is a P$^-$N junction.

In another aspect the photosensitive diffusion junction is a P$^+$N junction.

In another aspect the photosensitive diffusion junction is a PN$^-$ junction.

In another aspect the photosensitive diffusion junction is a PN$^+$ junction.

In another aspect the photosensitive diffusion junction is a P$^+$N$^-$ junction.

In another aspect the photosensitive diffusion junction is a P$^+$N$^+$ junction.

In another aspect the photosensitive diffusion junction is a Schottky barrier.

If the diffusion junction is a plurality of diffusion junctions then the plurality of diffusion junctions can contain one or more different types of the aforementioned photosensitive diffusion junctions.

In another aspect the photodiode device is an optical detector.

In another aspect the photodiode device is a polarization detector. A polarization detector as used herein is a device which is used to determine the polarization of incident electromagnetic radiation.

In another aspect the photodiode device is a wavelength detector.

In another aspect the photodiode device is a wavelength spectrometer. This could be manufactured for instance by having a resonant grating which separated different portions of the spectrum to one of a plurality of photosensitive diffusion junctions.

In another aspect the photodiode device is a wavelength division demultiplexer.

In another aspect the photodiode device is a solar cell.

In another aspect the invention provides for an integrated circuit including a plurality of photodiode devices according to any one of the preceding claims.

In another aspect the invention provides for a method of concentrating electromagnetic radiation in a photodiode device. The photodiode device includes a photosensitive diffusion junction within a single layer. In some cases the photosensitive diffusion junction is a plurality of photosensitive diffusion junctions. The photodiode device further includes a resonant grating located within the single layer. The photosensitive diffusion junction is located within the resonant grating. The method includes the step of illuminating the photodiode device with electromagnetic radiation. The method further includes the step of concentrating electromagnetic radiation incident on the photodiode device within the diffusion junction using the resonant grating.

In another aspect the electromagnetic radiation is polarized electromagnetic radiation. The resonant grating is formed from patterned dielectric material and the diffusion junction. In some cases multiple or a plurality of diffusion junctions can be used to partially form the resonant grating. The patterned dielectric material is formed by the repetition of a two-dimensional pattern which is adapted such that the rotation of the photodiode device relative to the polarization of the electromagnetic radiation determines the measured amplitude of the electromagnetic radiation. The method further includes the step of measuring a first intensity of electromagnetic radiation with the photodiode device. The method further includes the step of rotating the photodiode device. In some cases the photodiode device is rotated by 90 degrees. The rotation can be on the axis of the incident polarized electromagnetic radiation. The method further includes the step of measuring a second intensity of electromagnetic radiation with the photodiode device. The method further includes the step of calculating the polarization of the electromagnetic radiation. The photodiode device is rotated a known or predetermined angle. By combining the knowledge of how much the photodiode device was rotated and in comparing the first and second intensity measurements the polarization can be calculated.

In another aspect the photodiode device includes a plurality of layers each including a photosensitive diffusion junction within a single layer. Each of the plurality of layers includes a resonant grating. The photosensitive diffusion junction is located within the resonant grating in each layer. The resonant grating of each layer is adapted for concentrating electromagnetic radiation into the photosensitive diffusion junction of its layer in accordance with a wavelength dependent absorption curve. In other words the resonant grating of each layer is tuned such that the photosensitive diffusion junction is particularly sensitive to a particular band or section of wavelength. The wavelength dependent absorption curve of each of the plurality of layers is distinct. The method further includes the step of measuring an intensity of incident light with the photodiode device in each of the plurality of layers. The method further includes the step of calculating the wavelength of the incident light.

In another aspect the photodiode device includes a plurality of photosensitive diffusion junctions within a single layer, forming a plurality of resonant gratings. The plurality of photosensitive diffusion junctions is located within the resonant gratings. Each resonant grating is adapted for concentrating electromagnetic radiation into each of the photosensitive diffusion junctions in accordance with a wavelength dependent absorption curve. Each of the wavelength dependent absorption curves of each of the photosensitive diffusion junctions is distinct. The method further includes the step of measuring an intensity of incident light with each of the photosensitive diffusion junctions. The method further includes the step of calculating the wavelength of the incident light.

BRIEF DESCRIPTION OF DRAWINGS

FIG. 6 illustrates a photodiode device with contact layers according to an embodiment of the present invention;

FIG. 7 illustrates a photodiode device with utilizing a one-dimensional grating according to an embodiment of the present invention;

Other objects, aspects and advantages of the invention will become obvious in combination with the description of accompanying drawings, wherein the same number represents the same or similar parts in all figures.

DETAILED DESCRIPTION OF THE PREFERRED EMBODIMENTS

In the following, like numbered elements in these figures are either similar elements or perform an equivalent function. Elements which have been discussed previously will not necessarily be discussed in later figures if the function is equivalent.

Figure 1:
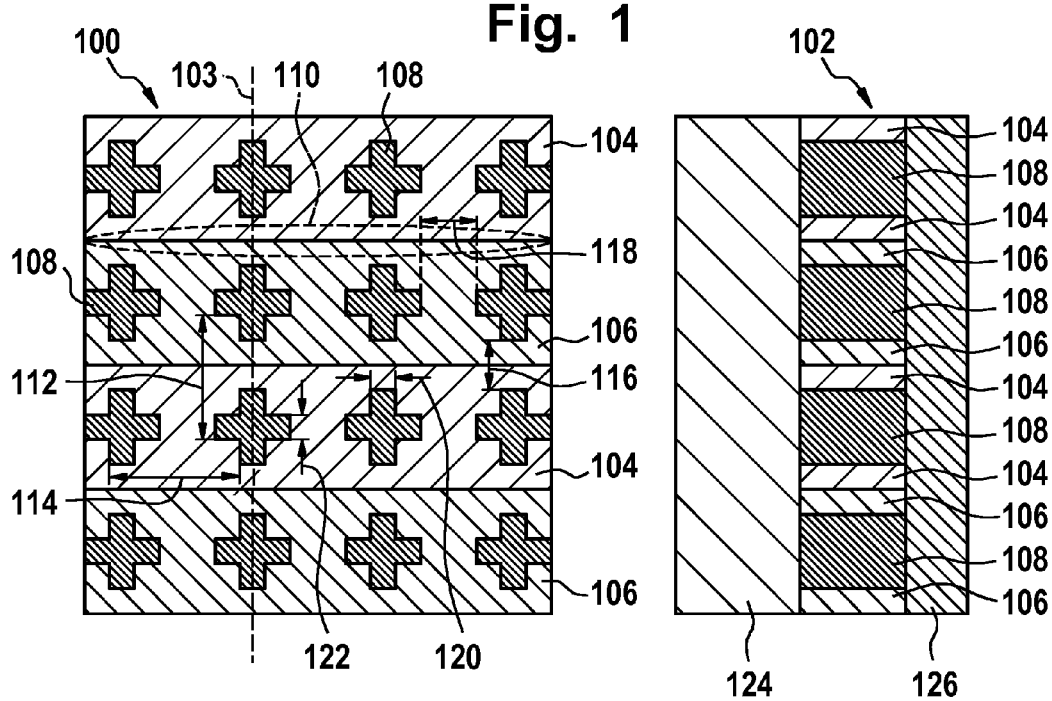
FIG. 1 illustrates a photodiode device according to an embodiment of the present invention.

FIG. 1 illustrates an embodiment of a photodiode device according to the invention. In FIG. 1 shallow trench isolation or STI is used to generate one or two-dimensional gratings. The oxide wells which are used conventionally to isolate transistors and circuits are now used to form a grating structure. The grating is now positioned in the same layer as the absorption layer. The absorption layer is the layer where the photosensitive diffusion junction is. In FIG. 1 a top view 100 and a side view 102 are shown with the photodiode device. The dashed line 103 in FIG. 1 shows the section line of the side view 102. The regions labeled 104 are p+ silicon and the regions labeled 106 are n+ silicon. The cross-like structures which are labeled 108 are shallow trench isolation 108. One PN junction 110 is shown. The PN junction is an example of a photosensitive diffusion junction. The cross-like structure is made of shallow trench isolation 108, a repetition distance of py 112 in the y-direction and a repetition distance in the x-direction px 114. The distance in the y-direction between the cross-like structures is dy 116 and the distance between them in the x-direction is dx 118. The width of the cross-like structure in the y-direction is wy 122 and is dimension wx 120 in the x-direction.

The side view shows a silicon nitride (SiN) overlay 124, which was not shown in the top view (left). It is used for protecting the photodiode device, for example passivation. The device is also shown as being formed on a buried oxide 126 layer. Incident light reaches the photodiode device through the silicon nitride overlay.

Figure 2:
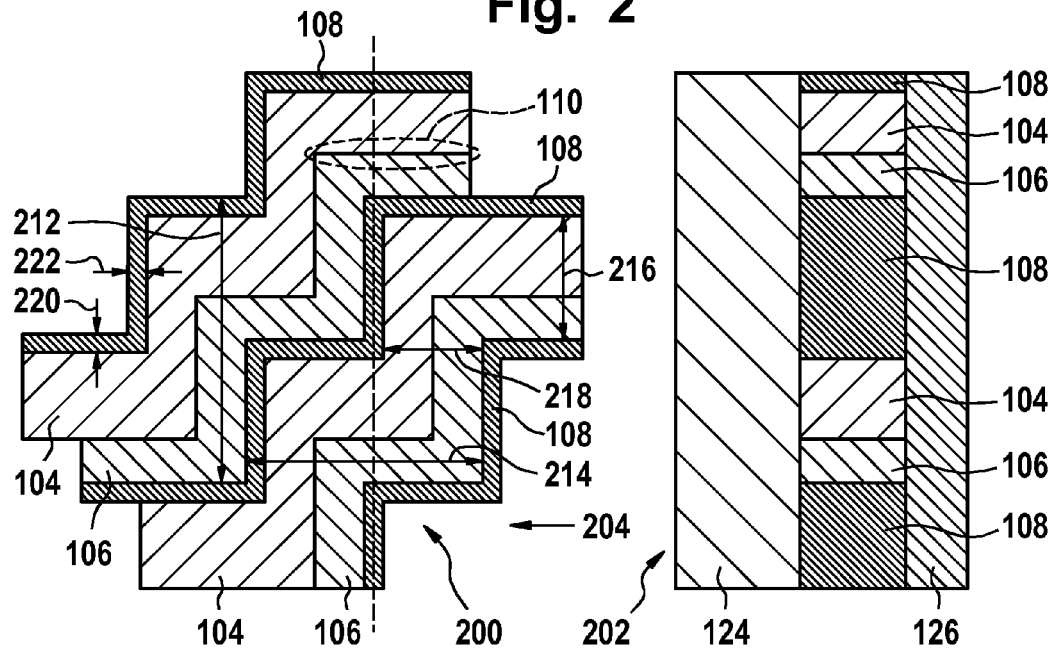
FIG. 2 illustrates a photodiode device according to a further embodiment of the present invention.

In FIG. 2 an alternative embodiment of a photodiode device according to the invention is illustrated. In this example a staircase-shaped gradient is formed with the shallow trench isolation and p- and n-doped crystal silicon. The p-silicon is labeled 104 and the n-silicon is labeled 106. There are staircase-like bands of both the p and n-type silicon which are then also separated by layers of shallow trench isolation 108. A PN-junction is labeled 110. The arrow 204 shows a direction from which the side view 202 is shown. As with FIG. 1 the silicon nitride overlay 124 was not shown in the top view 200. Again light is able to reach the PN-junction 110 through the silicon nitride 124 overlay. Again the device is also formed on a buried oxide 126 layer. The repetition period of the repetition distance of the pattern in the y-direction is py 212. The repetition distance of the pattern in the x-direction is 214. The width of the combined PN channel in the y-direction is dy 216. The gross width of the PN channel in the x-direction is dx 218. The width of the shallow trench isolation 108 in the y-direction is wy 220 and the width of the shallow trench isolation 108 in the x-direction is wx 222.

Figure 3:
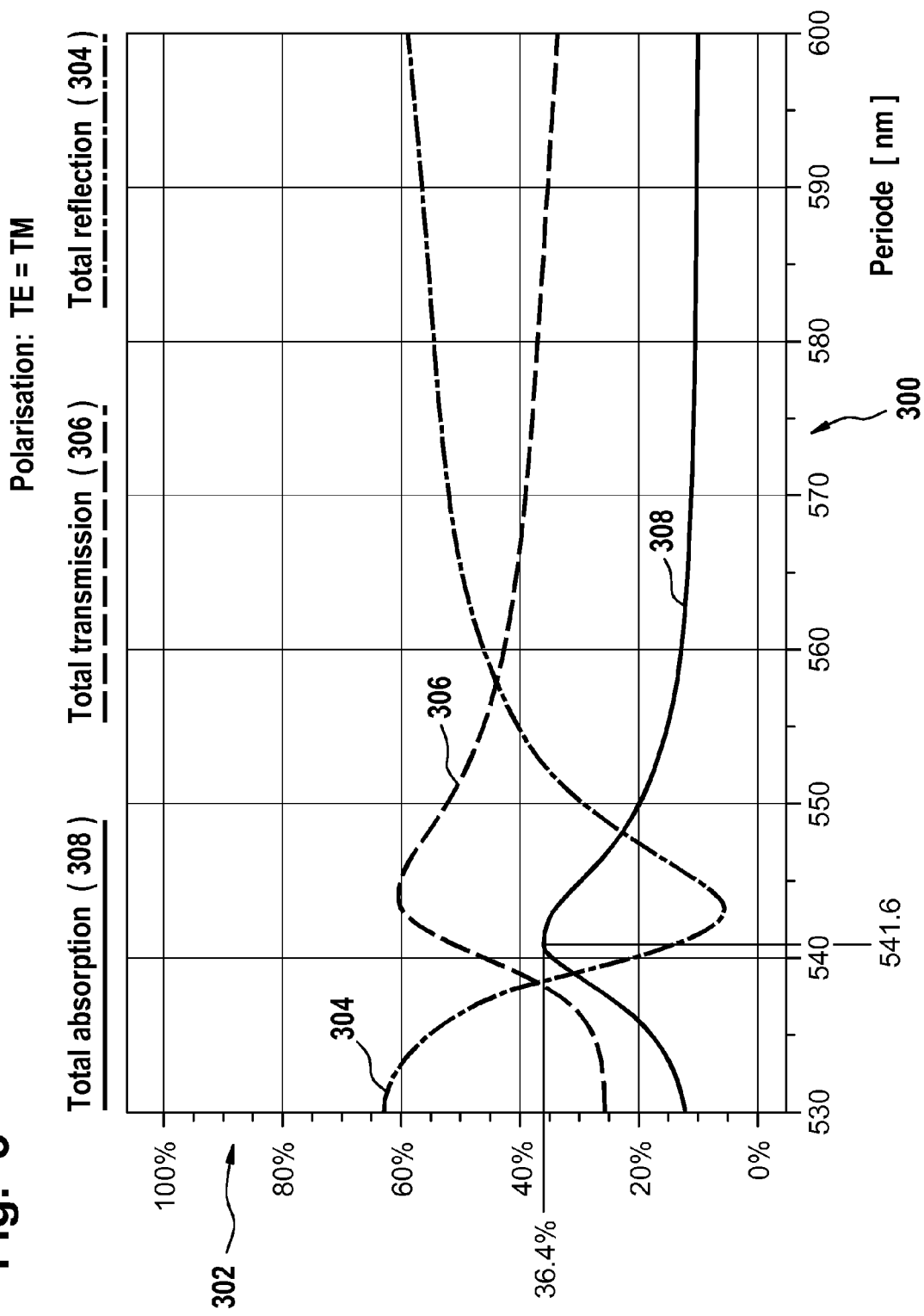
FIG. 3 shows a graph of calculated values of the diffraction order transmission, reflection and absorption in an interleaved shallow trench isolation resonant grating with vertical light incident upon it.

FIG. 3 shows the diffraction or the transmission, reflection and absorption in an interleaved shallow trench isolation resonant grating with vertical light incident upon it. These values are calculated. The x-axis is the period in nanometers and the y-axis is the percentage. Curve 304 is the diffraction or the transmission, curve 306 is the reflection or the transmission and curve 308 is the absorption order transmission.

Figure 4:
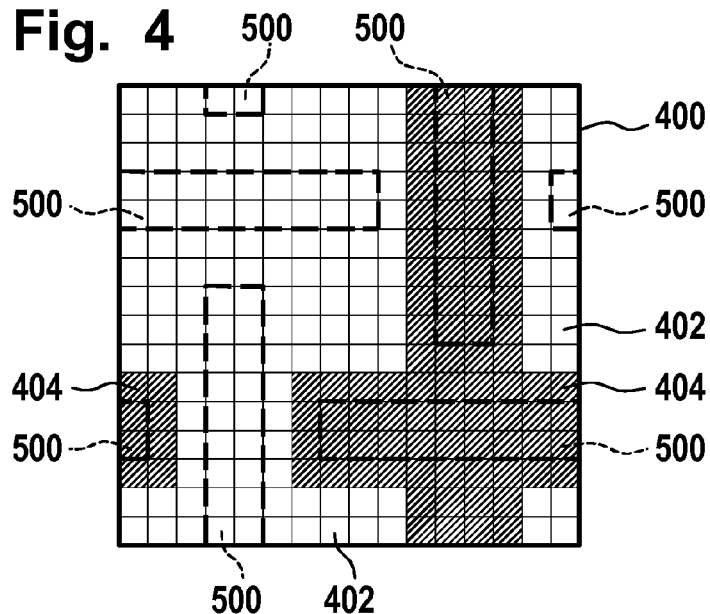
FIG. 4 illustrates a photodiode device according to a further embodiment of the present invention with P and N regions.
Figure 5:
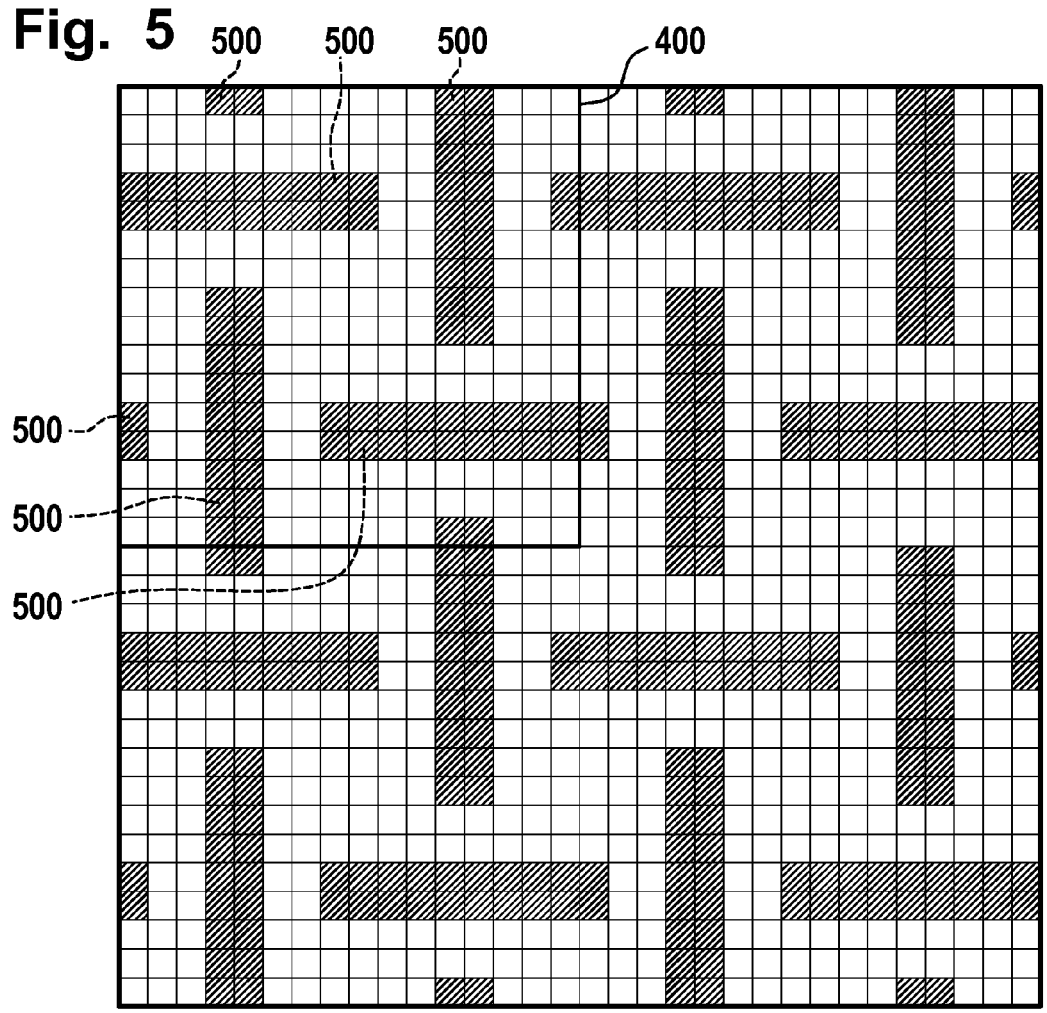
FIG. 5 illustrates an interleaved type diffraction grating according to an embodiment of the present invention.

FIGS. 4 and 5 illustrate an interleaved type diffraction grating. In FIG. 5 there is a box labeled 400. This shows the location of a base cell which can be used for creating a tile of devices and gratings. The region labeled 402 is the P-type silicon. The region labeled 404 is the n-type silicon. Within FIG. 5 the shaded regions labeled 500 of which only are labeled within the box 400 show the location of where the shallow trench isolation 500 is placed. The interleaved two-dimensional grating has openings to provide electrical contact for all PN locations.

The grating can be formed in various configurations as depicted in FIG. 1 and FIG. 2. The best results have been obtained from a configuration as shown in FIGS. 4 and 5 for a polarization independent detection of an electromagnetic wave with vertical incidence. The amount of oxide and active silicon is also significant for the performance of the grating. With large silicon areas, a maximum of active area is provided and the amount of absorbed energy is increased. The oxide areas need to be large enough to obtain a usable grating. The design optimization is performed by vectorial numeric simulation for example by using the Rigorous Coupled Wave Analysis (RCWA), Finite-Difference Time-Domain (FDTD) or Vector Wave Propagation Method (VWPM). In an SOI-technology, the buried oxide (BOX) provides total internal reflection and thereby supports the preservation of irradiance in the active region and then increases the total amount of local absorption.

All configurations allow the use of lateral contacts by a special distribution of P- and N-doped regions as shown in FIG. 6 and FIG. 7. The design thereby minimizes the amount of metal in the active area. Thereby, a maximum amount of irradiance can enter the active region of the device. In order to further enhance the efficiency of a device, the use of a bulk diode is proposed. Such a diode can be combined with the STI-grating in order to further increase the efficiency of a detector.

Simulations of the resonant grating have shown that a total absorption of approximately 40% can be obtained for a TE-polarized wave. With a TM-polarized wave, a total absorption of approximately 30% is obtained. In case of a two-dimensional grating, the total absorption of the grating and bulk diode is 36.4% as shown in FIG. 3. The underlying process implies limitations to the available grating dimensions and in case of a CMOS-SOI process, the minimum distances need to be considered. This necessitates an optimization process with boundary conditions to find the optimal configuration of the device. The optimization of the STI-grating has been performed with three-dimensional RCWA by consideration of these boundary conditions.

FIG. 6 shows a further embodiment of a photodiode device according to the invention. The photodiode device is located in layer 600. There are additional layers 604 above this that are labeled m1-m5. Other devices or circuitry could be located in these levels. Incident light is indicated by the arrows labeled 602. Photodiode device 600 is built on a p-type substrate 606, with a layer of buried oxide on top of it 608. Layer 608 is not mandatory. In FIG. 6, the photodiode device 600 is built upon the buried oxide layer 608. There is a resonant junction layer under the photodiode devices formed in the p-substrate. Below one device there is an n-type silicon band 614 and below an additional device is a p+ substrate contract 616.

FIG. 7 shows a further embodiment of a photodiode device according to an embodiment of the invention. In this example there can be seen fingers of P-type silicon 702 that interleave with fingers of N-type silicon 704. Within each of the P-type and N-type fingers there is a dielectric grating 706. In the N-type silicon 704 there are cathode contacts 710 and in the P-type silicon 702 there are anode contacts 708. This is an example of a one-dimensional grating.

Figure 8:
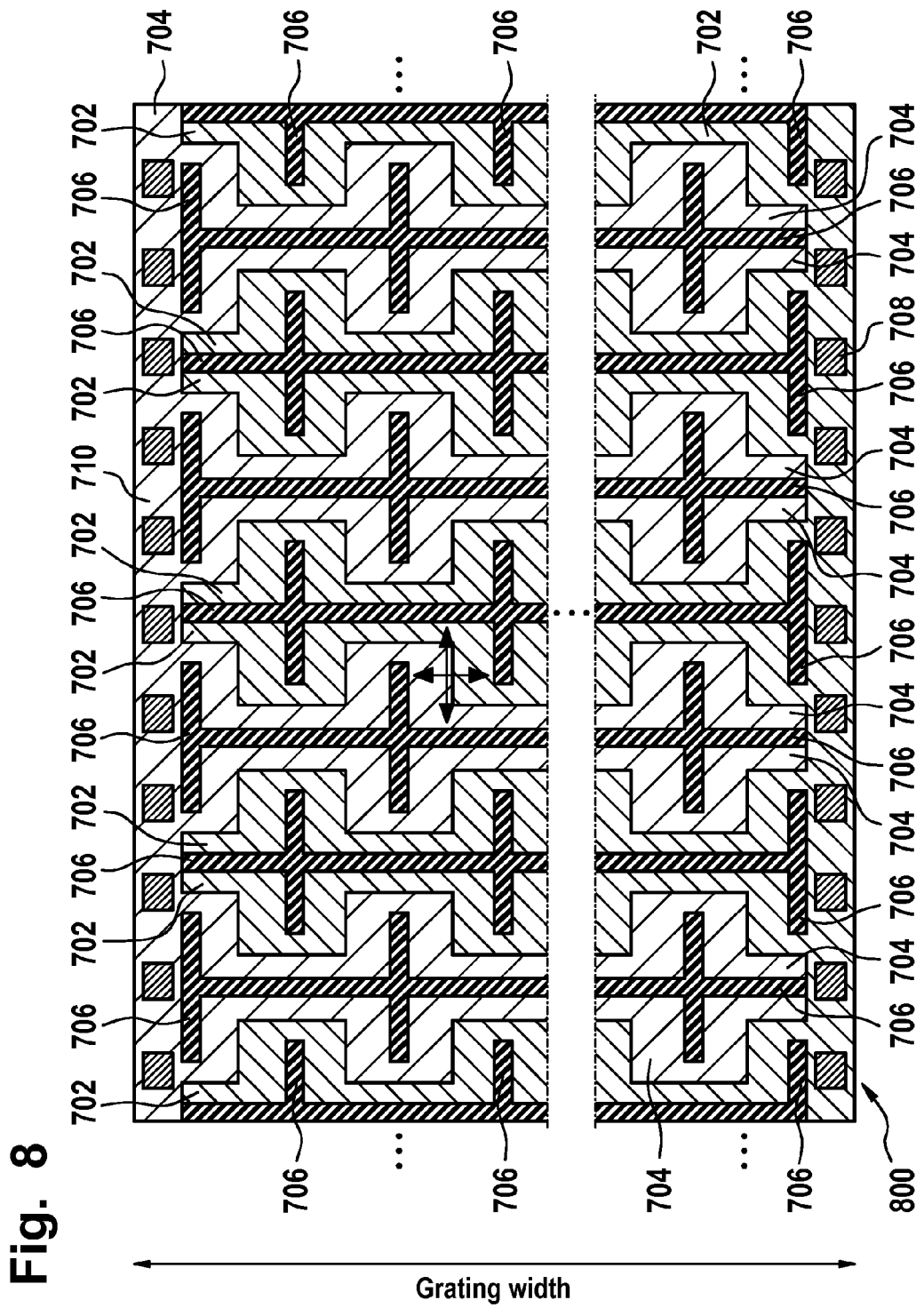
FIG. 8 illustrates a photodiode device and contacts to the P and N regions of the junction according to an embodiment of the present invention.

FIG. 8 shows an example of a photodiode device 800 according to a further embodiment of the invention. The photodiode device 800 shown in FIG. 8 is very similar to that shown in FIG. 7 except in this case there is a two-dimensional grating. The P-type substrate is still labeled 702 and the N-type is still labeled 704. The dielectric diffraction grating is labeled 706 and is a form of connected cross-like structures or can also be described as a comb-like structure.

Figure 9:
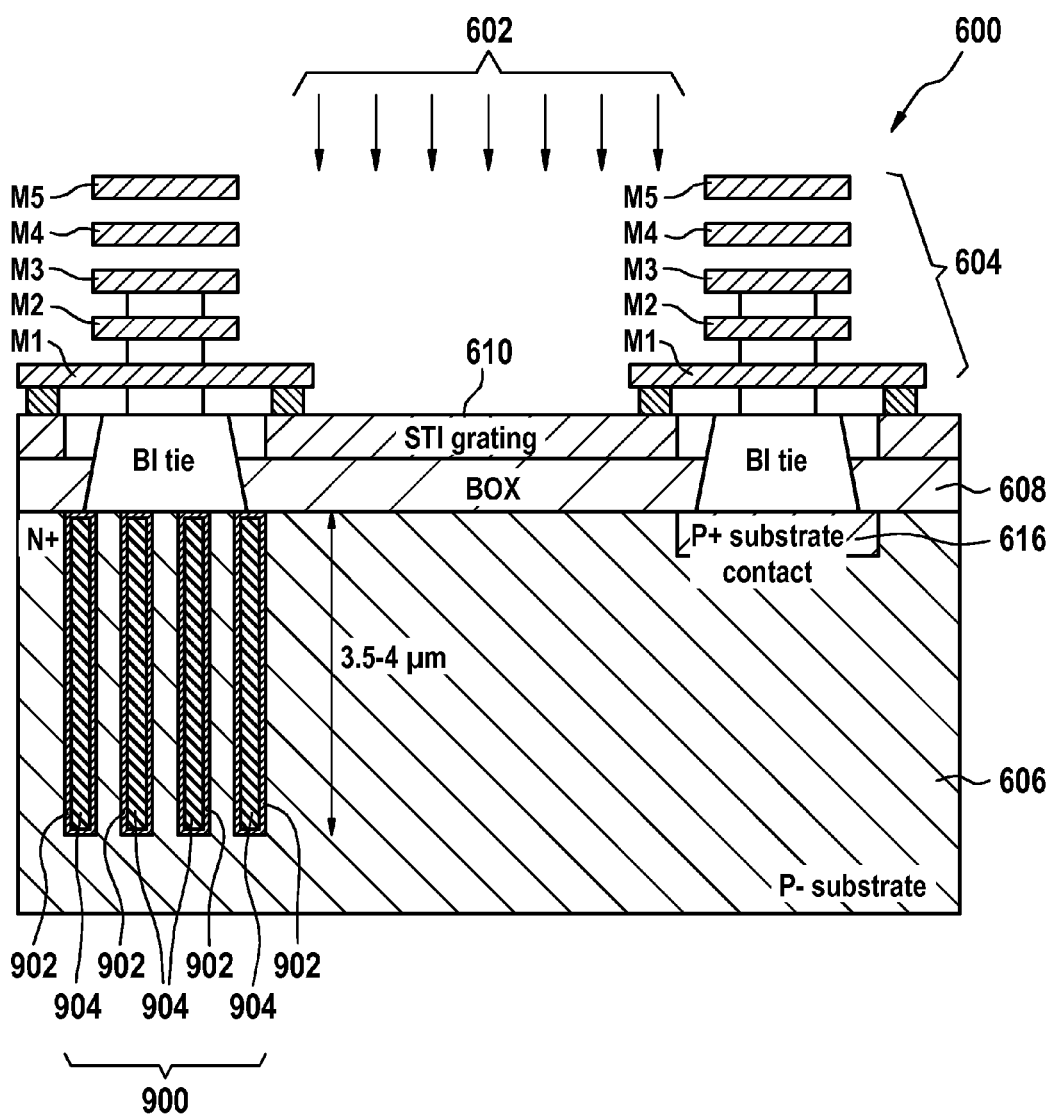
FIG. 9 illustrates a photodiode device with a deep-trench bulk diode according to an embodiment of the present invention.

FIG. 9 shows a photodiode device 600 similar to that shown in FIG. 6. In this case the N-band of FIG. 6 has been replaced with a series of deep-trench diodes 900. The deep-trench diodes were cut using a plasma as is used for manufacturing the deep-trench technologies as used for manufacturing embedded DRAM. The channels were then doped with N-type silicon 902 then were filled with dielectric 904. A plurality of deep-trench diodes 900 forms a resonance structure which enhances the absorption of electromagnetic radiation. The trenches that the deep-trench diodes are formed in, can for instance be 3.5 to 4 micrometers deep.

Figure 10:
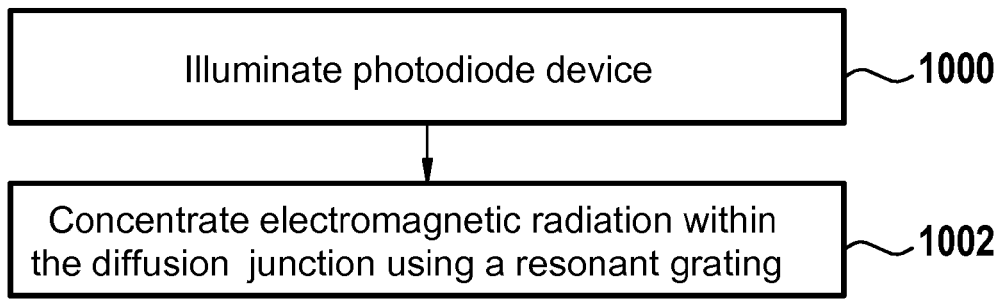
FIG. 10 shows a flow diagram which illustrates an embodiment of a method according to the present invention.

FIG. 10 shows a flow diagram which illustrates an embodiment of a method according to the invention. In step 1000 the photodiode device is illuminated with electromagnetic radiation. In step 1002 electromagnetic radiation is concentrated within the at least one diffusion junction using a resonant grating.

Figure 11:
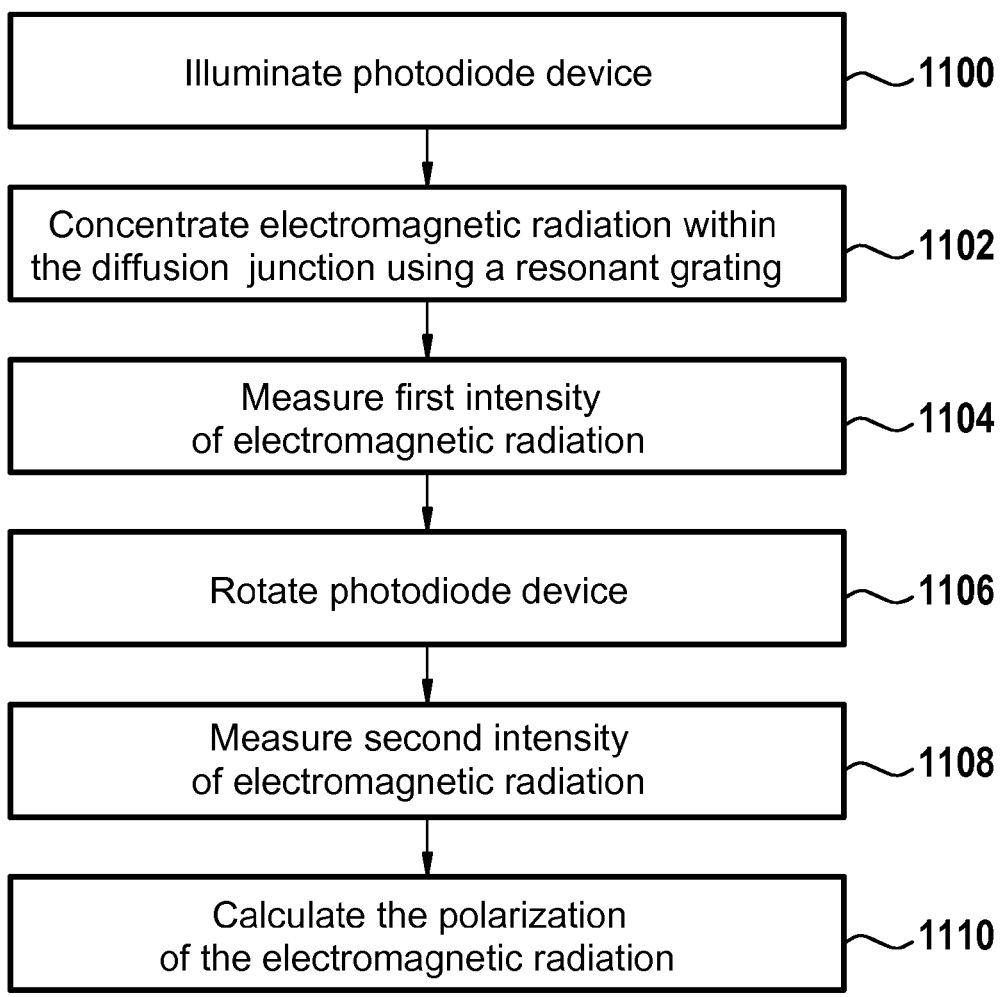
FIG. 11 shows a flow diagram which illustrates a further embodiment of a method according to the present invention.

FIG. 11 shows a flow diagram which illustrates a further embodiment of a method according to the invention. In step 1100 the photodiode device is illuminated. In step 1102 electromagnetic radiation is concentrated within the diffusion junction using a resonant grating. In step 1104 a first intensity is measured of the electromagnetic radiation based on the amount of voltage or current created within the diffusion junction. Next the photodiode device is rotated in step 1106. The photodiode device can be rotated for instance 90 degrees or a predetermined or known angular amount. The device is rotated about the incident illumination. Next in step 1108 a second intensity of electromagnetic radiation is measured using the at least one diffusion junction. In step 1110 the polarization of the electromagnetic radiation is calculated using knowledge of how much the device is rotated plus the values of the first intensity and the second intensity.

Figure 12:
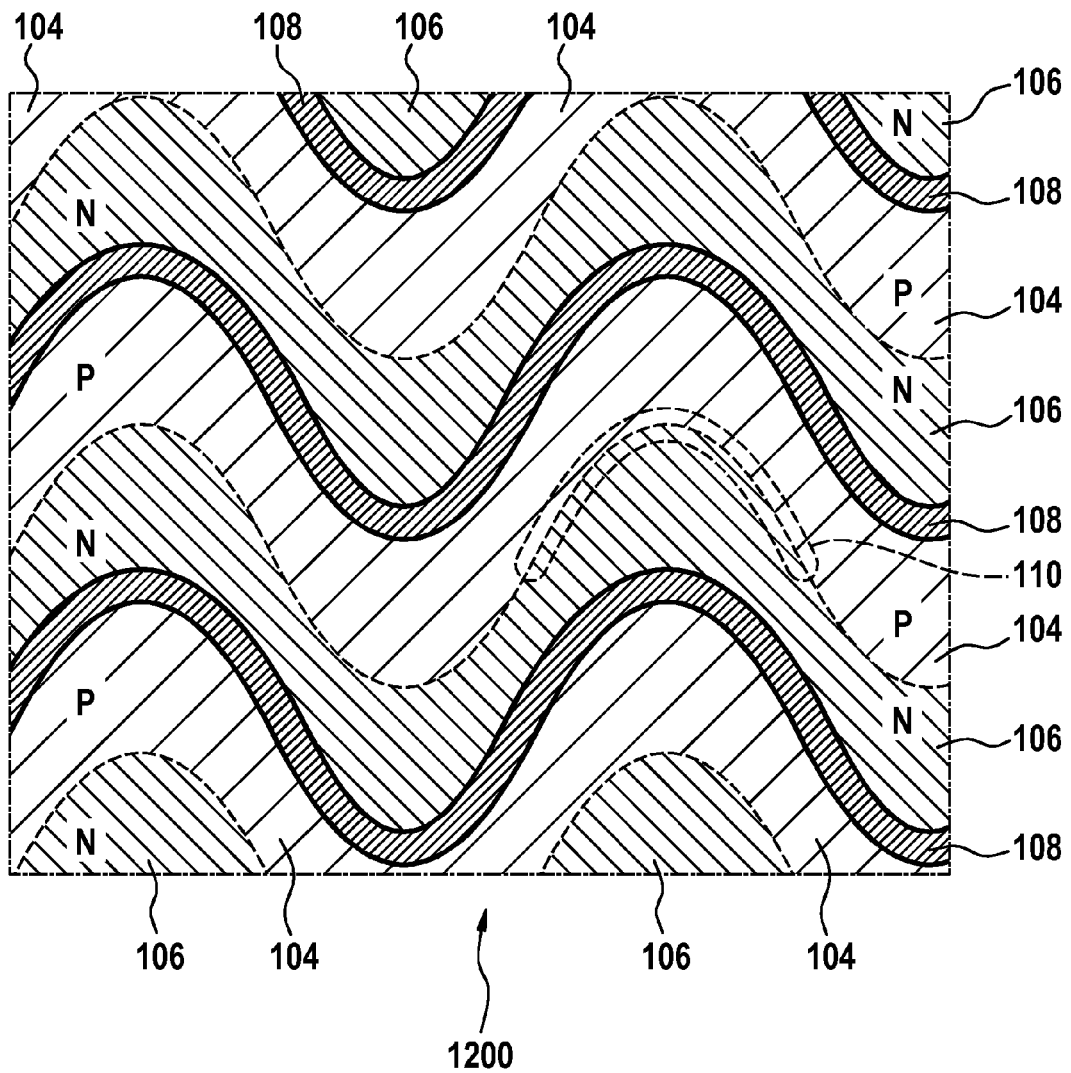
FIG. 12 illustrates a photodiode device according to a further embodiment of the present invention.

FIG. 12 illustrates an alternative embodiment of a photodiode device 1200 according to the invention. In this example a sinusoidal like structures is formed with the shallow trench isolation and p- and n-doped crystal silicon. The p-silicon is labeled 104 and the n-silicon is labeled 106. There are sinusoidal shaped bands of both the p-type 104 and n-type 106 silicon which are then also separated by layers of shallow trench isolation 108. The PN junction is labeled 110. As with the photodiode devices 100, 200 shown in FIGS. 1 and 2 the photodiode device 1200 can be covered with a silicon nitride overlay. The photodiode device can be formed on a buried oxide layer (not shown).

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

We claim:

1. A photodiode device comprising:
    a photosensitive diffusion junction within a single layer; and
    a resonant grating located within the single layer, wherein the photosensitive diffusion junction is located within the resonant grating.

2. The photodiode device of claim 1, wherein the resonant grating is adapted for concentrating electromagnetic radiation incident on the photodiode device within the diffusion junction.

3. The photodiode device of claim 1, wherein the resonant grating is formed from patterned dielectric material and the diffusion junction.

4. The photodiode device of claim 3, wherein the dielectric material is shallow trench isolation.

5. The photodiode device of claim 3, wherein the patterned dielectric material is formed by the repetition of a two-dimensional pattern.

6. The photodiode device of claim 5, wherein the two-dimensional pattern is formed by any one of the following: the repetition of cross like structures, the repetition of stair like structures, the repetition of comb like structures, the repetition of sinusoidal like structures, and combinations thereof.

7. The photodiode device of claim 1, wherein the photodiode device is formed on a buried oxide layer, and wherein the buried oxide layer is formed on bulk silicon.

8. The photodiode device of claim 7, wherein there is at least one bulk silicon photodiode in the bulk silicon, wherein the at least one photodiode is under the diffusion junction.

9. The photodiode of claim 8, wherein the at least one bulk silicon photodiode is a plurality of deep-trench PN junctions.

10. The photodiode device of claim 8, wherein the bulk silicon photodiode is connected in parallel or series with the diffusion junction.

11. The photodiode device of claim 8 wherein at least one resonant absorption layer is formed in the bulk silicon.

12. The photodiode device of claim 1, wherein the photosensitive diffusion junction is any one of the following: a PN junction, a $P^-N$ junction, a $P^+N$ junction, a $PN^-$ junction, a $PN^+$ junction, a $P^+N^-$ junction, a $P^+N^+$ junction, a Schottky Barrier.

13. The photodiode device of claim 1, wherein the photodiode device is any one of the following: an optical detector, a polarization detector, a wavelength detector, a wavelength spectrometer, a wavelength division demultiplexer, and a solar cell.

14. A method of concentrating electromagnetic radiation in a photodiode device, wherein the photodiode device comprises a photosensitive diffusion junction within a single layer; wherein the photodiode device further comprises a resonant grating located within the single layer, wherein the photosensitive diffusion junction is located within the resonant grating, and wherein the method comprises the steps of:
    illuminating the photodiode device with electromagnetic radiation; and
    concentrating electromagnetic radiation incident on the photodiode device within the diffusion junction using the resonant grating.

15. The method of claim 14, wherein the electromagnetic radiation is polarized electromagnetic radiation, wherein resonant grating is formed from patterned dielectric material and the diffusion junction, wherein the patterned dielectric material is formed by the repetition of a two-dimensional pattern which is adapted such that the rotation of the photodiode device relative to the polarization of the electromagnetic radiation determines the measured amplitude of the electromagnetic radiation, the method further comprises the steps of:
    measuring a first intensity of electromagnetic radiation with the photodiode device;
    rotating the photodiode device;
    measuring a second intensity of electromagnetic radiation with the photodiode device; and
    calculating the polarization of the electromagnetic radiation.

* * * * *